US012671315B2

(12) United States Patent
Du et al.

(10) Patent No.: US 12,671,315 B2
(45) Date of Patent: Jun. 30, 2026

(54) ADAPTIVE SILICON CARBIDE GATE DRIVERS IN INTEGRATED CIRCUIT FORM

(71) Applicant: BOARD OF TRUSTEES OF THE UNIVERSITY OF ARKANSAS, Little Rock, AR (US)

(72) Inventors: Xia Du, Fayetteville, AR (US); Liyang Du, Fayetteville, AR (US); Andrea Stratta, Fayetteville, AR (US); Asif Faruque, Fayetteville, AR (US); H. Alan Mantooth, Fayetteville, AR (US); Yuqi Wei, Fayetteville, AR (US)

(73) Assignee: BOARD OF TRUSTEES OF THE UNIVERSITY OF ARKANSAS, Little Rock, AR (US)

( * ) Notice: Subject to any disclaimer, the term of this patent is extended or adjusted under 35 U.S.C. 154(b) by 296 days.

(21) Appl. No.: 18/238,622

(22) Filed: Aug. 28, 2023

(65) Prior Publication Data

US 2024/0072637 A1     Feb. 29, 2024

Related U.S. Application Data

(60) Provisional application No. 63/401,504, filed on Aug. 26, 2022.

(51) Int. Cl.
H02M 1/088 (2006.01)
H02M 1/00 (2006.01)
(Continued)

(52) U.S. Cl.
CPC ......... H02M 1/088 (2013.01); H02M 1/0009 (2021.05); H02M 1/08 (2013.01);
(Continued)

(58) Field of Classification Search
CPC .... H02M 1/0006; H02M 1/0009; H02M 1/08; H02M 1/084; H02M 1/088; H02M 1/44;
(Continued)

(56) References Cited

U.S. PATENT DOCUMENTS 8,823,018 B2    9/2014  Yoneyama et al.
9,722,595 B2    8/2017  Tao et al.
(Continued)

FOREIGN PATENT DOCUMENTS

EP           4047666 A1 *  8/2022  .............. H02M 1/00
WO    WO2019046033 A1    3/2019

OTHER PUBLICATIONS

Y. Wei, D. Woldegiorgis, R. Sweeting and A. Mantooth, "Four Control Freedoms AGD for Hybrid SiC MOSFET and Si IGBT Application," 2021 IEEE Applied Power Electronics Conference and Exposition (APEC), 2021, pp. 2211-2216.
(Continued)

*Primary Examiner* — Gary L Laxton
*Assistant Examiner* — Jennifer C Caulk
(74) *Attorney, Agent, or Firm* — Robert A. Voigt; Shackelford, McKinley & Norton, LLP

(57)          ABSTRACT

A multiphase converter for reducing the input and output current ripples. The multiphase converter includes a system controller and power devices. Furthermore, the multiphase converter includes an active gate driver integrated circuit (IC) electrically connected to the system controller and the power devices. The active gate driver IC receives signals from the system controller and provides outputs to the power devices based, at least in part, on real-time feedback from the power devices.

7 Claims, 15 Drawing Sheets

(51) Int. Cl.

| | |
|---|---|
| *H02M 1/08* | (2006.01) |
| *H02M 1/084* | (2006.01) |
| *H02M 1/15* | (2006.01) |
| *H02M 3/00* | (2006.01) |
| *H03K 17/14* | (2006.01) |
| *H03K 17/687* | (2006.01) |

(52) U.S. Cl.
CPC ............. *H02M 1/084* (2013.01); *H02M 1/15* (2013.01); *H02M 3/003* (2021.05); *H03K 17/145* (2013.01); *H03K 17/6871* (2013.01); *H02M 1/0006* (2021.05)

(58) Field of Classification Search
CPC ... H02M 7/493; H03K 17/164; H03K 17/167; H03K 17/145; H03K 17/6871
See application file for complete search history.

(56) References Cited

U.S. PATENT DOCUMENTS

| | | | | |
|---|---|---|---|---|
| 9,954,522 | B2 | 4/2018 | Lu et al. | |
| 2013/0063184 | A1 | 3/2013 | Liang et al. | |
| 2014/0035628 | A1* | 2/2014 | Oaklander ............ | H02M 3/156 327/109 |
| 2018/0026628 | A1 | 1/2018 | Lu et al. | |
| 2021/0313801 | A1* | 10/2021 | Albertini ............. | H02M 1/0006 |
| 2022/0345126 | A1* | 10/2022 | Harriman ............. | H02M 3/158 |

OTHER PUBLICATIONS

Y. Wei, X. Du, D. Woldegiorgis and A. Mantooth, "Application of An Active Gate Driver for Paralleling Operation of Si IGBT and SiC MOSFET," 2021 IEEE 12th Energy Conversion Congress & Exposition—Asia (ECCE—Asia), 2021, pp. 314-319.

Barlow, Matthew; Ahmed, Shamim; Francis, Anthony; Mantooth, H.A.; (2019). An Integrated SiC CMOS Gate Driver for Power Module Integration. IEEE Transactions on Power Electronics. pp. 1-1. 10.1109/TPEL.2019.2900324.

R. R. Lamichhane et al., "A wide bandgap silicon carbide (SiC) gate driver for high-temperature and high-voltage applications," 2014 IEEE 26th International Symposium on Power Semiconductor Devices & IC's (ISPSD), 2014, pp. 414-417, doi: 10.1109/ISPSD. 2014.6856064.

M. N. Ericson et al., "An integrated gate driver in 4H—SiC for power converter applications," 2014 IEEE Workshop on Wide Bandgap Power Devices and Applications, 2014, pp. 66-69, doi: 10.1109/WiPDA.2014.6964626.

S. Zhao, X. Zhao, A. Dearien, Y. Wu, Y. Zhao and H. A. Mantooth, "An Intelligent Versatile Model-Based Trajectory-Optimized Active Gate Driver for Silicon Carbide Devices," in IEEE Journal of Emerging and Selected Topics in Power Electronics, vol. 8, No. 1, pp. 429-441, Mar. 2020.

D. Bortis, P. Steiner, J. Biela and J. W. Kolar, "Double-stage gate drive circuit for parallel connected IGBT modules," IEEE Trans. Dielectr. Electr. Insul., pp. 1020-1028, Aug. 2009.

Y. Wen, Y. Yang and Y. Gao, "Active Gate Driver for Improving Current Sharing Performance of Paralleled High-Power SiC MOSFET Modules," in IEEE Transactions on Power Electronics, vol. 36, No. 2, pp. 1491-1505, Feb. 2021, doi: 10.1109/TPEL.2020.3006071.

* cited by examiner

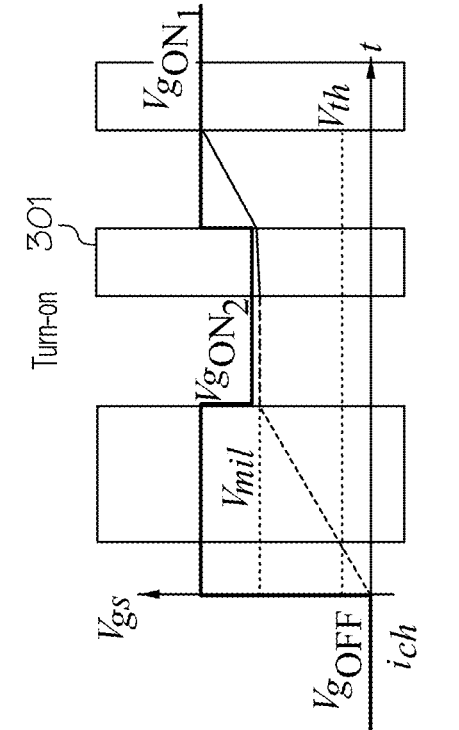
*Traditional Gate Driver*
Turn-on
FIG. 3B
Four Level Active Gate Driver
Turn-on
FIG. 3D
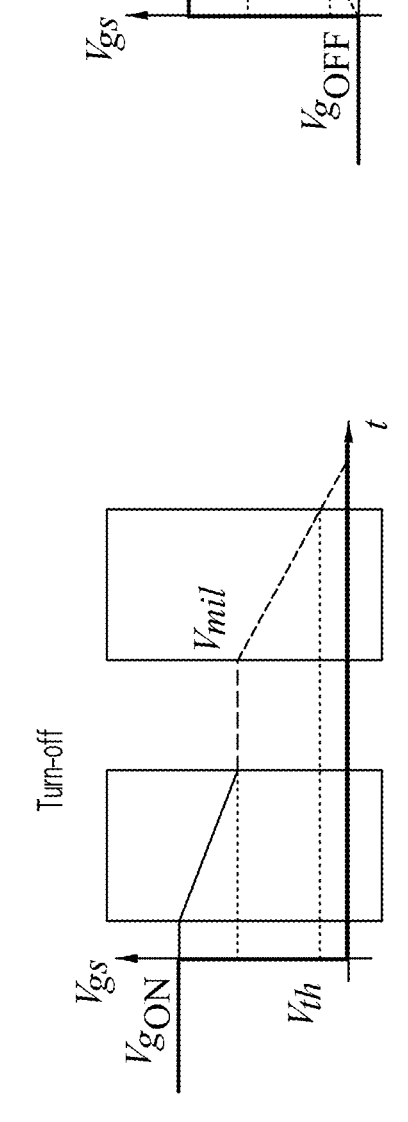
*Traditional Gate Driver*
Turn-off
FIG. 3A
Four Level Active Gate Driver
Turn-off
FIG. 3C

ADAPTIVE SILICON CARBIDE GATE DRIVERS IN INTEGRATED CIRCUIT FORM

GOVERNMENT RIGHTS

This invention was made with government support under Grant No. DE0000895 awarded by the U.S. Department of Energy. The U.S. government has certain rights in the invention.

TECHNICAL FIELD

The present invention relates generally to gate drivers, and more particularly to adaptive silicon carbide gate drivers in integrated circuit form.

BACKGROUND

A gate driver is a power amplifier that accepts a low-power input from a controller integrated circuit (IC) and produces a high-current drive input for the gate of a high-power transistor, such as an insulated-gate bipolar transistor (IGBT) or power metal-oxide-semiconductor field-effect transistor (MOSFET). Gate drivers can be provided either on-chip or as a discrete module. In essence, a gate driver consists of a level shifter in combination with an amplifier. A gate driver IC serves as the interface between control signals (digital or analog controllers) and power switches (e.g., IGBTs, MOSFETs, silicon carbide (SiC) MOSFETs, and gallium nitride (GaN) high electron mobility transistors (HEMTs)).

SUMMARY

In one embodiment of the present disclosure, a multiphase converter comprises a system controller and a plurality of power devices. The multiphase converter further comprises an active gate driver integrated circuit (IC) electrically connected to the system controller and the plurality of power devices, where the active gate driver IC receives signals from the system controller and provides outputs to the plurality of power devices based, at least in part, on real-time feedback from the plurality of power devices.

In another embodiment of the present disclosure, a power module package comprises a silicon carbide (SiC) active gate driver. The power module package further comprises silicon carbide (SiC) power devices connected to the SiC active gate driver.

The foregoing has outlined rather generally the features and technical advantages of one or more embodiments of the present disclosure in order that the detailed description of the present disclosure that follows may be better understood. Additional features and advantages of the present disclosure will be described hereinafter which may form the subject of the claims of the present disclosure.

BRIEF DESCRIPTION OF THE DRAWINGS

A better understanding of the present invention can be obtained when the following detailed description is considered in conjunction with the following drawings, in which:

FIGS. 3A-3D illustrate a comparison between the traditional gate driver gate voltage waveforms with the four level active gate driver gate voltage waveforms in accordance with an embodiment of the present disclosure;

DETAILED DESCRIPTION

Figure 1:
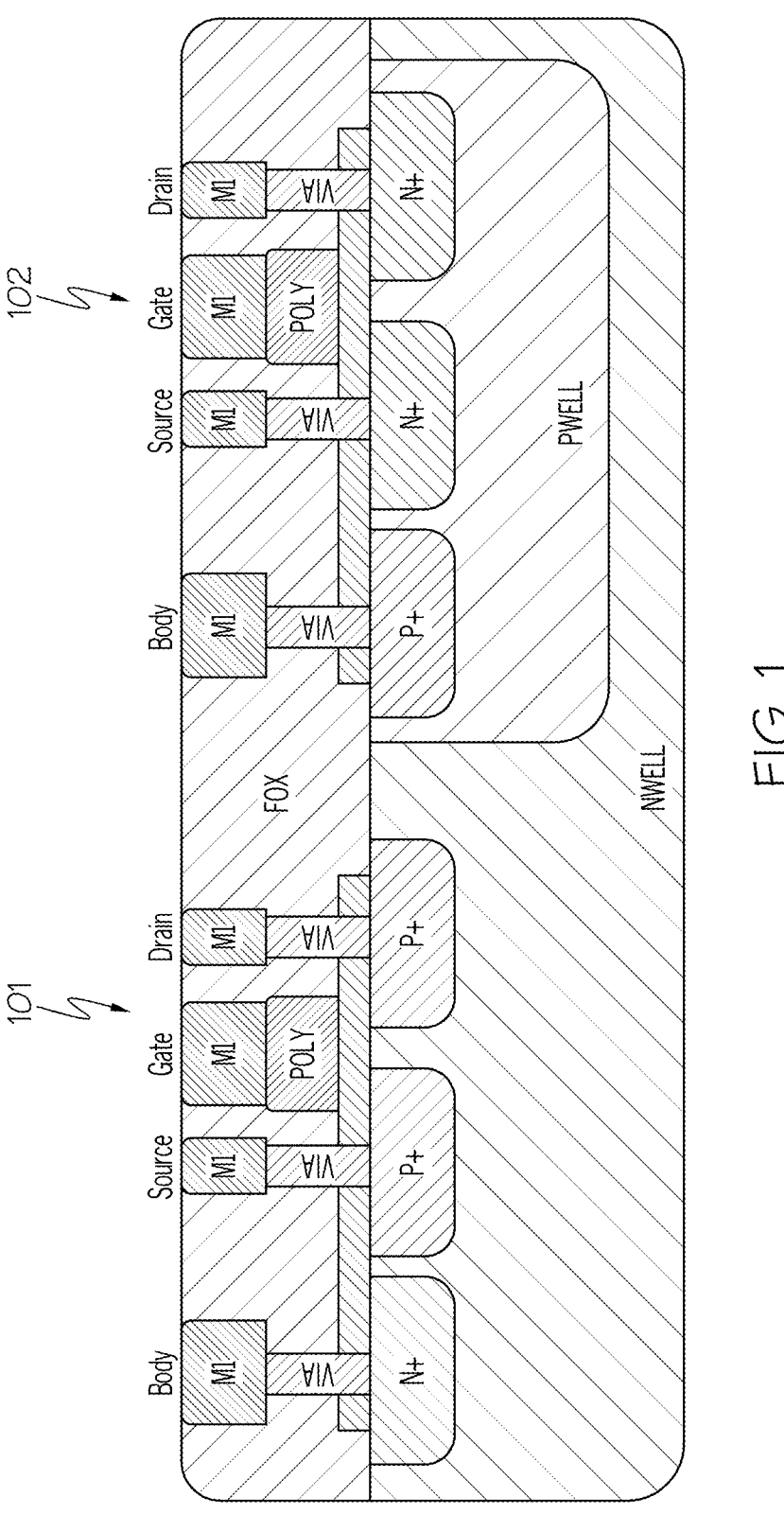
FIG. 1 illustrates the cross-section of MOSFETS using the SiC CMOS 1 μm process in accordance with an embodiment of the present disclosure.

As stated in the Background section, a gate driver is a power amplifier that accepts a low-power input from a controller integrated circuit (IC) and produces a high-current drive input for the gate of a high-power transistor, such as an insulated-gate bipolar transistor (IGBT) or power metal-oxide-semiconductor field-effect transistor (MOSFET). Gate drivers can be provided either on-chip or as a discrete module. In essence, a gate driver consists of a level shifter in combination with an amplifier. A gate driver IC serves as the interface between control signals (digital or analog controllers) and power switches (e.g., IGBTs, MOSFETs, silicon carbide (SiC) MOSFETs, and gallium nitride (GaN) high electron mobility transistors (HEMTs)).

Wide bandgap semiconductors (also known as WBG semiconductors or WBGSs) are semiconductor materials which have a larger band gap than conventional semiconductors. Conventional semiconductors, such as silicon, have a bandgap in the range of 0.6-1.5 electronvolt (eV), whereas, wide bandgap materials have bandgaps in the range above 2 eV. Generally, wide bandgap semiconductors have electronic properties which fall in between those of conventional semiconductors and insulators.

Such wide bandgap semiconductors have recently been utilized in power electronics. Wide bandgap semiconductors, such as SiC, GaN, and diamond, show superior material properties, which allow operation at high-switching speed, high-voltage, and high-temperature. The increase in switching frequency causes a reduction in the size of energy storage components (inductors and capacitors) and the high temperature sustaining capacity reduces heat sink requirements for power electronic circuitry.

Unfortunately, such wide bandgap devices, such as wide bandgap power devices, are limited by factors, such as unprecedented drain-to-source current and drain-to-source voltage, imbalanced behavior amongst parallel-connected devices, high temperature, and degradation mechanisms.

More intelligent and integrated gate driver circuits can be the solution to unleash the wide bandgap power devices full potential. Switching speeds for SiC MOSFET-based power modules are higher than silicon IGBT-based modules; therefore, special considerations are required to ensure a module's optimal performance. The interconnect parasitics between the gate driver and the module housing need to be kept as small as possible to avoid potential oscillation across the power devices that results from faster switching transitions and the correspondingly higher di/dt. Integration of a gate driver inside the module reduces the aforementioned effects tremendously. Standard silicon (Si) based gate drivers cannot operate at temperatures as high as SiC power devices, which are rated for 175° C. and above. Silicon-on-insulator (SOI) based gate drivers can operate at 175° C., but their integration inside the module would still pose issues due to the coefficient of thermal expansion (CTE) mismatch between silicon and the SiC substrate material of the power FET. An all-SiC based approach to match the CTE of the gate driver and SiC power die through standard packaging techniques, such as flip-chip, can be realized. Such heterogeneous integration will significantly reduce the parasitics inside the module. In addition, it will also increase power density, improve reliability, and lower electromagnetic interference (EMI) stress on the power devices.

Another challenge to address is the potential current imbalance between power SiC devices/modules that are connected in parallel. In ideal conditions, every device/module connected in parallel carries an equal share of the total load current. Mismatches in the circuit (e.g., parasitic inductances) or parametric variation of the SiC semiconductor devices properties (e.g., threshold voltage) can be responsible for unequal distribution of the current, both under steady-state (static imbalance) and transient (dynamic imbalance) conditions. Static or dynamic imbalanced current sharing results in different solicitations among the paralleled devices, thus reducing the lifetime of the device (e.g., power device) or even immediate failure of the most solicited ones. Gate driver circuits with extended functionality can be used in this case to sense the current imbalance and act to achieve correct sharing. These gate driver circuits are currently made of several discrete commercial components, but they can be integrated into a unique SiC IC that can be integrated inside the power module resulting in a compact heterogeneous solution that reduces system complexity and improves reliability.

In various embodiments, SiC ICs can lead to the possibility of higher temperature operation and faster switching speed when compared with conventional technologies. For example, the circuit parasitics can be reduced significantly. Further, in various embodiments, adaptive active gate drivers (AGDs), which produce switching waveforms with less electromagnetic interference, can increase the control flexibility of semiconductors so that their potential can be explored fully. In addition, the lifetime of the device (e.g., power device) can be prolonged with AGD and critical issues, including EMI noise, unbalanced current sharing among paralleled devices, and unbalanced voltage sharing among series-connected devices can be mitigated.

The disclosure and principles described herein enable SiC ICs to realize high temperature and compact gate drivers for wide bandgap devices/modules that have longer lifetimes than incumbent silicon circuits in the harsher power module environment. The SiC-based gate driver enables heterogeneous integration within wide bandgap power devices/modules thanks to their high-temperature capability. Additionally, experimental results show that there is a performance improvement in switching losses using a SiC gate driver as the temperature increases, while Si-based gate drivers show opposite trends limiting the maximum operating temperature.

Furthermore, the principles of the present disclosure enable AGDs to increase the control of semiconductor power devices by extending the functionalities of traditional gate drivers. This aspect can be important when using wide bandgap semiconductor devices because additional degrees of freedom, like a multilevel variable gate voltage, can be used to perform essential operations, such as electromagnetic interference (EMI) reduction and current balancing among parallel-connected devices. Experimental evidence has proven that using an AGD current balancing algorithm can be implemented effectively. The feedback of real-time circuit information to an AGD-based SiC, single-chip gate driver achieves a world-first adaptive gate driver technology operational in-module.

In one embodiment, the gate driver design is realized in a SiC complementary metal-oxide semiconductor (CMOS) process, fabricated at Fraunhofer IISB. In one embodiment, the technology node is 1 μm where the die of the SiC gate driver (including the SiC active gate driver discussed further below) includes a single metal layer and a single polysilicon layer. Due to complex processing modules, the turnaround time for this process is typically longer than silicon processes. The availability of primitive devices in this process permits the designer to make complex designs. However, with only a single metal layer, routing is a challenge. The polysilicon layer is used as a second routing layer. The cross-section of such a SiC CMOS is shown in FIG. 1.

Referring to FIG. 1, FIG. 1 illustrates the cross-section of MOSFETS 101, 102 using the SiC CMOS 1 μm process in accordance with an embodiment of the present disclosure.

Figure 2B:
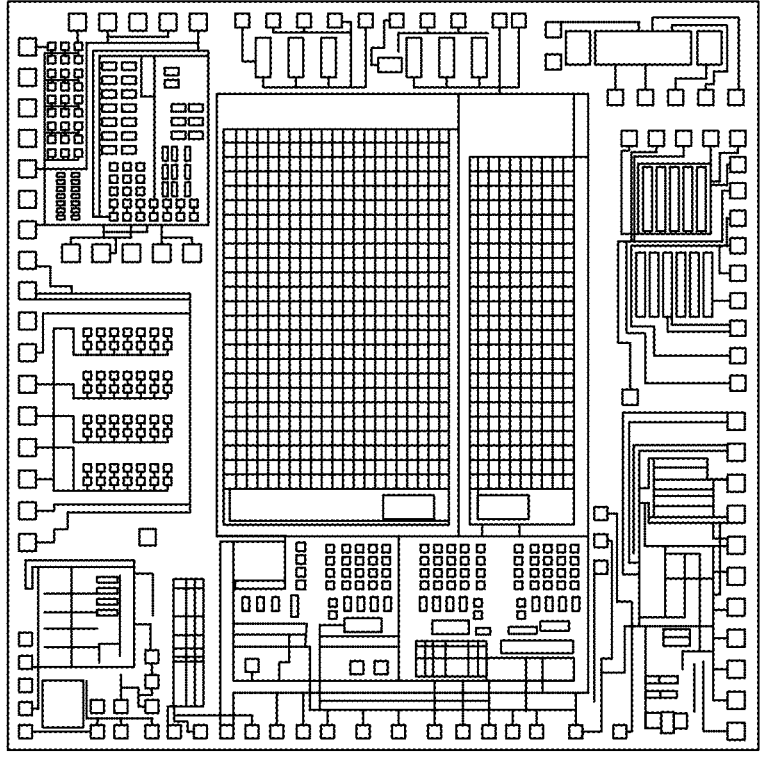
FIGS. 2A-2C illustrate the die micrographs of three CMOS-based gate driver variants in accordance with an embodiment of the present disclosure.
Figure 2A:
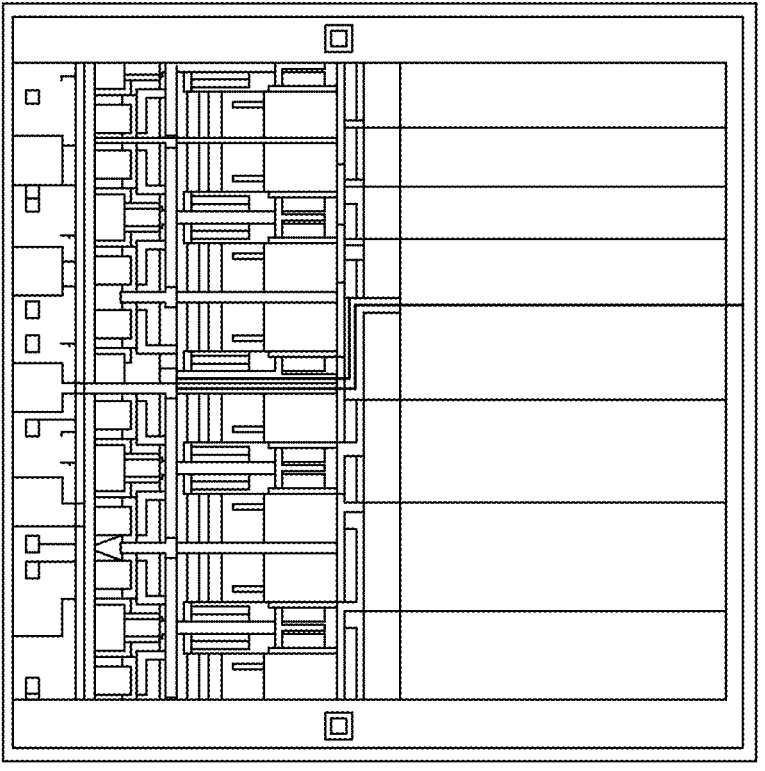
Figure 2C:
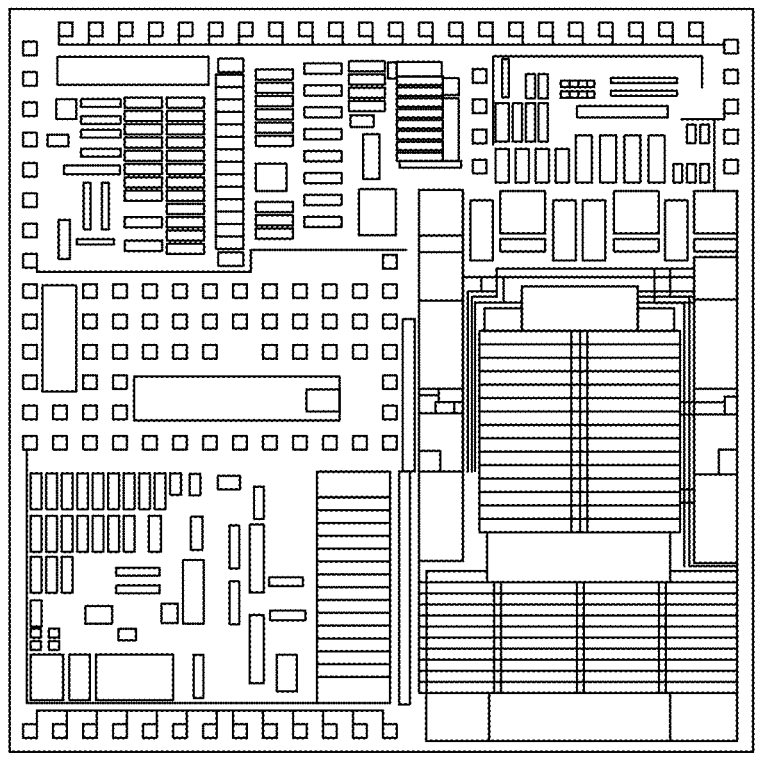

In one embodiment, two fabrication runs were performed with this process. The purpose of the first run was to characterize the devices and create fitted device models to design circuits, such as the gate driver and other periphery circuits. In one embodiment, four different gate driver variants were fabricated on the wafers. In one embodiment, each gate driver is unique in terms of architecture and device length. Among them, variant 2 is an NFET-based pull-up and pull-down gate driver with suboptimal performance. FIGS. 2A-2C illustrate the die micrographs of the other three CMOS-based gate driver variants in accordance with an embodiment of the present disclosure. In one embodiment, the die area of such die micrographs corresponds to an area of 4.94 mm×4.94 mm.

In one embodiment, the three gate driver variants are tested for critical performance parameters, such as drive currents, output voltage swing, propagation delay, rise and fall times, and switching frequency. Tables 1 to 3 represent the measured key parameters for the SiC gate drivers. All the gate drivers are characterized with the 10 nF of load capacitance. Measurements are carried out on the probe station, and the test setup remains the same for all the gate drivers.

TABLE 1

MEASURED RESULTS FOR VARIANT 1 (SiC1)

| Parameters | Measured Results (25° C.) | Measured Results (200° C.) |
|---|---|---|
| Peak Drive Current | 2.26 A (sink) | 2.1 A (sink) |
| | 1.04 A (source) | 1.15 A (source) |
| Output Voltage Swing | 14.96 V to −3.98 V | 14.98 V to −3.97 V |
| Propagation Delays | 895 ns (Falling) | 472 ns (Falling) |
| | 972 ns (Rising) | 497 ns (Rising) |
| Rise and Fall Times | 485 ns (Falling) | 294 ns (Falling) |
| | 876 ns (Rising) | 687 ns (Rising) |
| Switching Frequency | 20 kHz | 20 kHz |

TABLE 2

MEASURED RESULTS FOR VARIANT 3 (SiC3)

| Parameters | Measured Results (25° C.) | Measured Results (200° C.) |
|---|---|---|
| Drive Current | 4.04 A (sink) | 4.14 A (sink) |
| | 1.99 A (source) | 2.65 A (source) |
| Output Voltage Swing | ~14.97 V to −3.98 V | ~14.98 V to −3.99 V |
| Propagation Delays | 1.2 us (Falling) | 564.3 ns (Falling) |
| | 1 us (Rising) | 442 ns (Rising) |
| Rise and Fall Times | 555.5 ns (Falling) | 280 ns (Falling) |
| | 446.7 ns (Rising) | 402 ns (Rising) |
| Switching Frequency | 20 kHz | 20 kHz |

TABLE 3

MEASURED RESULTS FOR VARIANT 4 (SiC4)

| Parameters | Measured Results (25° C.) | Measured Results (200° C.) |
|---|---|---|
| Drive Current | 3.62 A (sink) | 5.19 A (sink) |
| | 0.96 A (source) | 1.25 A (source) |
| Output Voltage Swing | +14.95 V to −3.9 V | +14.9 V to −3.99 V |
| Propagation Delays | 455.4 ns (Falling) | 136.6 ns (Falling) |
| | 617.3 ns (Rising) | 185.2 ns (Rising) |
| Rise and Fall Times | 366.1 ns (Falling) | 172 ns (Falling) |
| | 582.3 ns (Rising) | 429 ns (Rising) |
| Switching Frequency | 20 kHz | 20 kHz |

The measured results verified the functionality of the gate driver both at room temperature and at an elevated temperature and represent the reduction to practice of the SiC single-chip gate driver. Further experimental and modeling results provide evidence of the higher reliability of the chip compared to silicon. SiC ICs can operate at a significantly higher temperature than their Si counterparts, allowing their integration within the power module package in close proximity to the SiC power die. However, a major challenge having a SiC module with an integrated SiC gate driver is how to address the potential current imbalance between SiC devices. AGDs have been largely used to address this challenge; however, their circuit presents more semiconductor components than standard gate drivers. A potential application for SiC CMOS technology is to fabricate a complex AGD circuit in a single IC for heterogenous module integration. This operation allows simplifying the AGD structure facilitating the design of scalable and distributed architecture to be used for current balancing among parallel-connected SiC devices/modules.

In one embodiment, the active gate driver (AGD) structure of the present disclosure, realized using discrete components, goes beyond the standard functional requirements for a traditionA gate driver, namely, turning on and off the power semiconductor devices because it controls how these transitions occur. While traditional gate drivers present two voltage levels, the active gate driver structure of the present disclosure is based on a multilevel gate voltage profile, thus providing more degrees of freedom in the power semiconductor device control. As shown in FIGS. 3A-3D, using four voltage levels, it is possible to control the duration of the turn-on and turn-off subintervals.

Referring to FIGS. 3A-3D, FIGS. 3A-3D illustrate a comparison between the traditional gate driver gate voltage waveforms with the four level active gate driver gate voltage waveforms in accordance with an embodiment of the present disclosure. Referring to FIGS. 3A-3B, FIGS. 3A-3B depict the traditional gate driver gate voltage waveforms during the duration of turn-on and turn-off. FIGS. 3C-3D depict the four level active gate driver gate voltage waveforms during the duration of turn-on and turn-off.

As illustrated in FIGS. 3C-3D, it is possible to control the duration of the turn-on subintervals 301 and turn-off subintervals 302.

FIGS. 4A-4E illustrate the unified multi-level AGD profile, which can be applied for all application scenarios, in accordance with an embodiment of the present disclosure.

In one embodiment, the unified AGD of the present disclosure has all the possible control freedoms for different applications. The gate driving profile can be simplified by using a reduced number of control freedoms according to the applications and requirements.

Figure 4A:
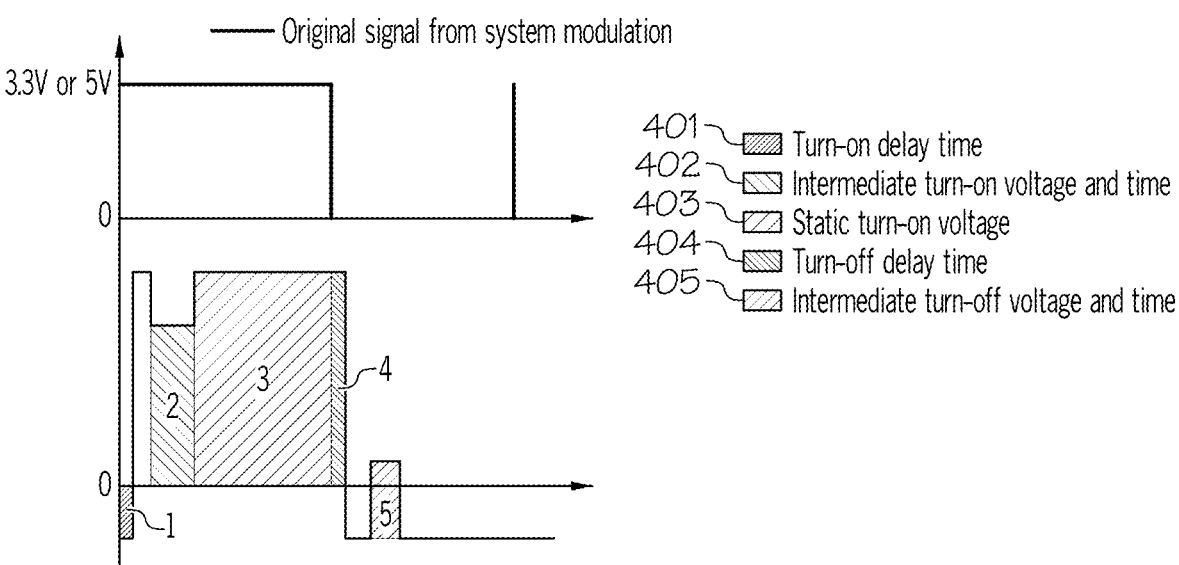
FIGS. 4A-4E illustrate the unified multi-level active gate driver (AGD) profile, which can be applied for all application scenarios, in accordance with an embodiment of the present disclosure.

For example, FIG. 4A illustrates the unified multi-level active gate driver profile, including the turn-on delay time 401, the intermediate turn-on voltage and time 402, the static turn-on voltage 403, the turn-off delay time 404 and the intermediate turn-off voltage and time 405 with respect to an original signal 406 from system modulation.

Figure 4B:
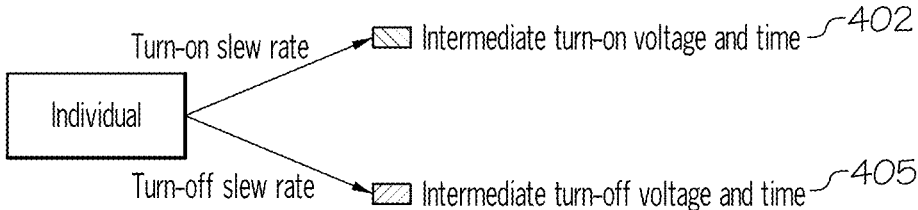

FIG. 49 illustrates the slew rate control involving individual wide bandgap devices, where slew rate is the maximum rate at which an amplifier can respond to an abrupt change of input level. In particular, FIG. 4B illustrates that the intermediate turn-on voltage and time 402 corresponds to the turn-on slew rate and that the intermediate turn-off voltage and time 405 corresponds to the turn-off slew rate.

Figure 4C:
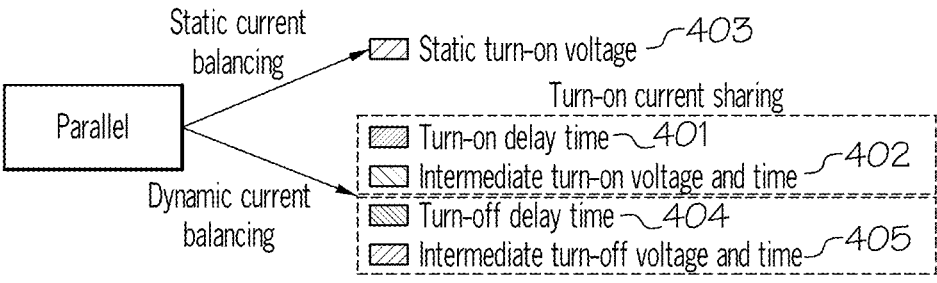

FIG. 4C illustrates the AGD of the present disclosure controlling the turning on and off of the power devices connected in parallel with current balancing control. In particular, the static current balancing includes the static turn-on voltage 403; whereas, the dynamic current balancing includes both turn-on current sharing (turn-on delay time 401 and intermediate turn-on voltage and time 402) and turn-off current sharing (turn-off delay time 404 and intermediate turn-off voltage and time 405).

Figure 4D:

FIG. 4D illustrate the AGD of the present disclosure controlling the turning on and off of the power devices connected in series with voltage balancing control. In particular, the dynamic voltage balancing includes turn-off delay time 404 and intermediate turn-off voltage and time 405.

Figure 4E:
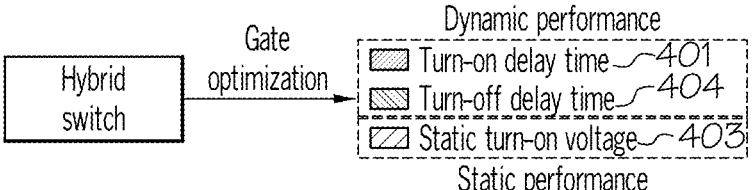

FIG. 4E illustrates the AGD of the present disclosure controlling the turning on and off of a hybrid switch with gate optimization. In particular, dynamic performance involves turn-on delay time 401 and turn-off delay time 404. Furthermore, static performance involves static turn-on voltage 403.

Figure 5:
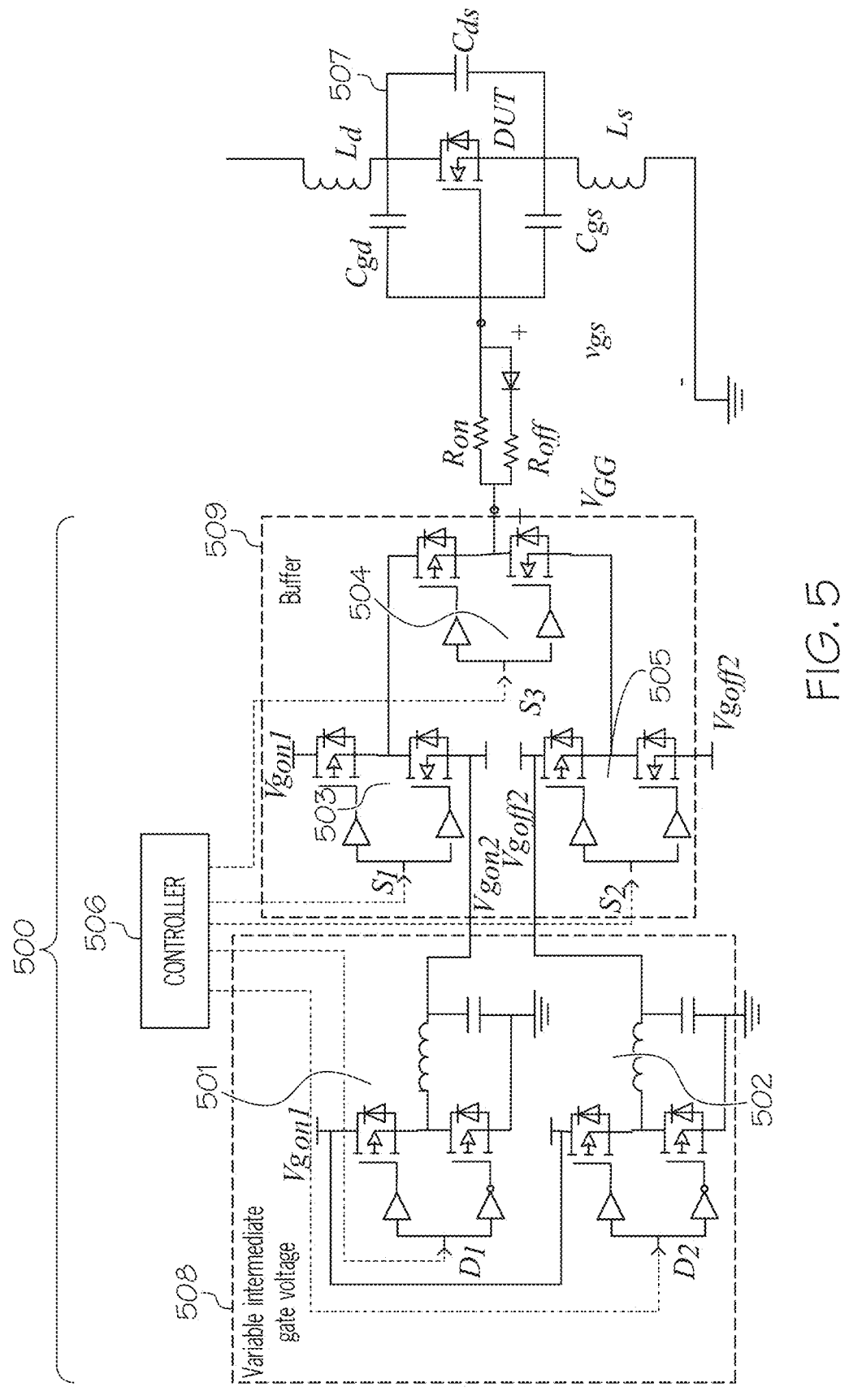
FIG. 5 illustrates an embodiment of the present disclosure of the structure of active gate driver.

One example of the circuit used to implement the unified AGD is shown FIG. 5. FIG. 5 illustrates an embodiment of the present disclosure of the structure of active gate driver 500.

Referring to FIG. 5, active gate driver 500 includes two buck converters 501, 502 used to generate the variable intermediate gate voltage 508 levels in turn-on (Vgon2) and in turn-off (Vgoff2). In one embodiment, in the buffer stage 509, three totem-pole circuits 503, 504, 505 are used to sink and source the gate current and select the appropriate voltage level for each interval.

The turn-on and turn-off transition speed is related to the rate of change of drain-to-source current, di/dt, and drain-to-source voltage, dv/dt. These two variables are responsible for electro-magnetic interference (EMI) issues. The introduction of intermediate voltage levels offers a solution to adjust the transitions' speed actively and mitigate EMI noise.

In addition, varying the gate voltage or adjusting the timing of the gate signals with respect to one another can be used as an action to achieve current balance over a broad operating range as demonstrated in FIG. 4C.

Furthermore, in one embodiment, a controller 506 controls the switching of the transistors of buck converters 501, 502 (see $D_1$ and $D_2$) and totem-pole circuits 503, 504, 505 (see $S_1$, $S_2$, and $S_3$).

Additionally, in one embodiment, active gate driver 500 drives current to a device under test (DUT) 507.

Figure 6:
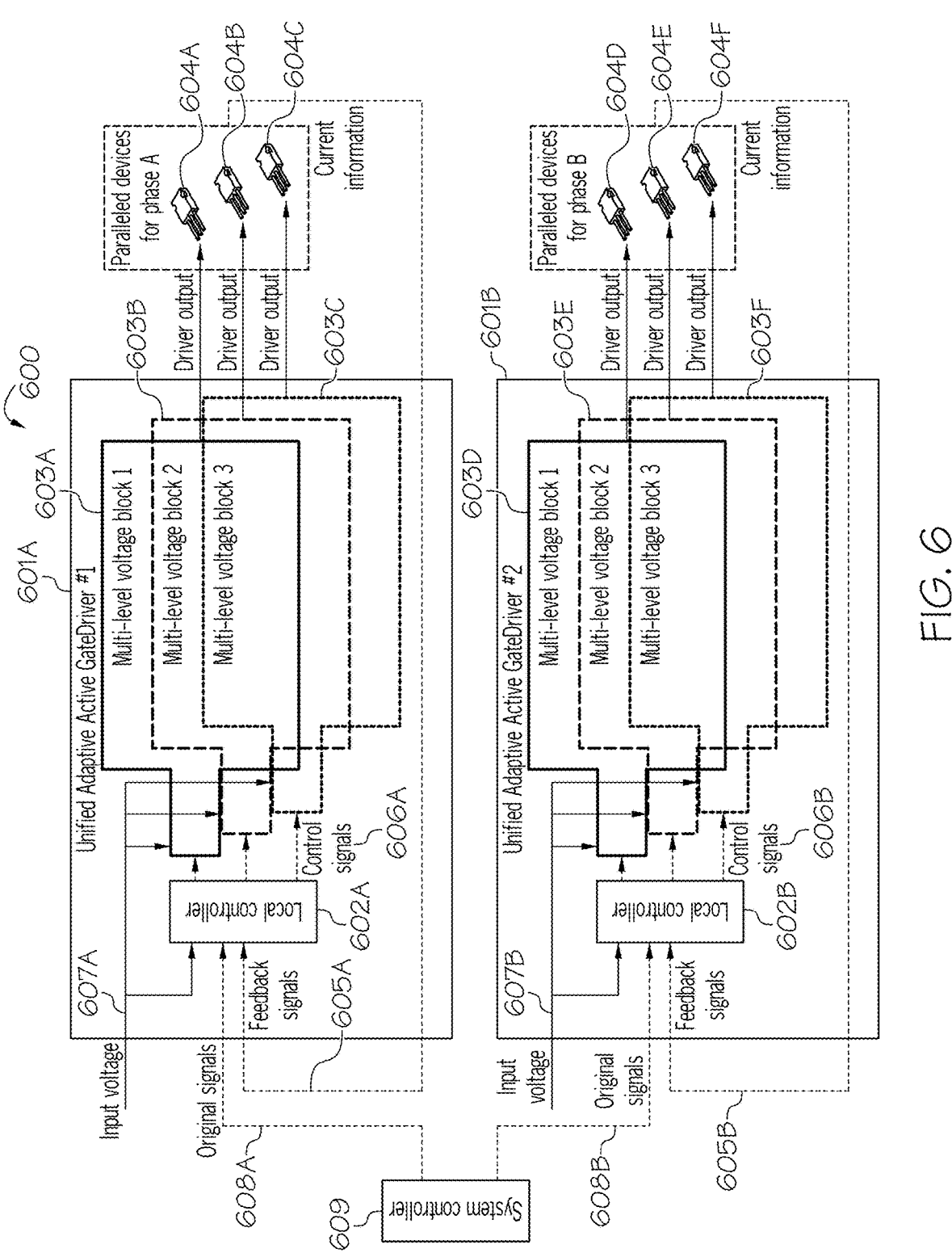
FIG. 6 illustrates a system-level schematic of a multiphase converter in which, to scale up power, each phase is constituted of n parallel-connected SiC power devices in accordance with an embodiment of the present disclosure.

FIG. 6 illustrates a system-level schematic of a multiphase converter 600 in which, to scale up power, each phase is constituted of n parallel-connected SiC power modules/devices in accordance with an embodiment of the present disclosure. In one embodiment, such a multiphase converter 600 is used for reducing the input and output current ripples.

Referring to FIG. 6, active gate drivers 601A, 601B with the structure of active gate driver 500 include a local controller 602A, 602B, respectively, to issue control signals (see control signals 606A, 606B) to multi-level voltage block 1, 2 and 3 603A-603C, 603D-603F, respectively, to control the power devices. Active gate drivers 601A, 601B may collectively or individually be referred to as active gate drivers 601 or active gate driver 601, respectively. Local controllers 602A, 602B may collectively or individually be referred to as local controllers 602 or local controller 602, respectively. Furthermore, multi-level voltage blocks 603A-603F may collectively or individually be referred to as multi-level voltage blocks 603 or multi-level voltage block 603, respectively.

In one embodiment, multi-level voltage blocks 603A-603C, 603D-603F drive the output to power devices 604A-604C, 604D-604F, respectively, where such power devices are connected in parallel. Power devices 604A-604F may collectively or individually be referred to as power devices 604 or power device 604, respectively.

Furthermore, as illustrated in FIG. 6, current information from power devices 604 is fed back (see feedback signals 605A, 605B) to local controller 602 in real-time, which is used by local controller 602 to provide outputs to power devices 604. Feedback signals 605A, 605B may collectively or individually be referred to as feedback signals 605 or feedback signal 605. Other inputs to local controller 602A, 602B used to generate control signals 606A, 606B, respectively, include input voltages 607A, 607B, respectively, and the original signals 608A, 608B, respectively, from system controller 609. Control signals 606A, 606B may collectively or individually be referred to as control signals 606 or control signal 606, respectively. Furthermore, input voltages 607A, 607B may collectively or individually be referred to as input voltages 607 or input voltage 607, respectively. Additionally, original signals 608A, 608B may collectively or individually be referred to as original signals 608 or original signal 608, respectively.

In one embodiment, local controller 602 senses the current of power devices 604. In one embodiment, local controller 602 executes a current balancing algorithm that varies outputs to power devices 604 based at least in part on the sensed current.

In one embodiment, local controller 602 varies the outputs to power devices 604 according to a multilevel voltage profile. In one embodiment, such a multilevel voltage profile includes three or more voltage levels.

In one embodiment, active gate driver 601 (e.g., active gate driver 601A) and power devices 604 (e.g., power devices 604A-604C) reside within a power module package.

Furthermore, in one embodiment, the AGD board contains local controller 602 that, after sensing the current of each power device 604, executes the current balancing algorithm. In one embodiment, the AGD board is designed to be scalable and add as many buffer stages (see, e.g., FIG. 5) as needed by the topology. Moreover, this structure can also be applied for other application scenarios, including paralleling operation, series operation, and hybrid switch operation. In various embodiments, a single-chip version of this driving capability can be achieved utilizing integrated, higher temperature current sensing, and voltage isolation in-module.

Figures 7A, 7B, 7C:
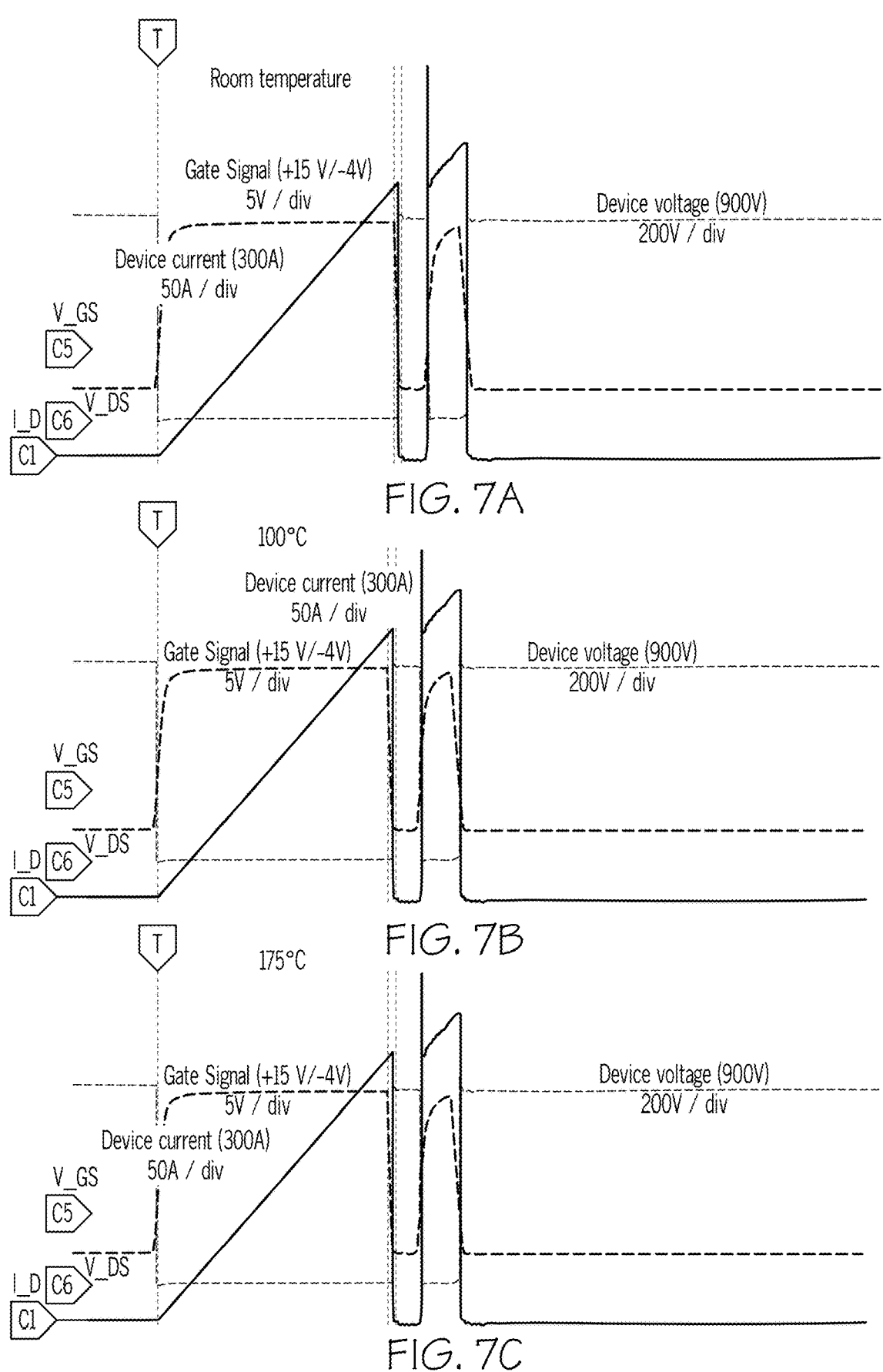
FIGS. 7A-7C illustrate the clamped inductive load (CIL) test results for one of the SiC integrated gate driver modules (SiC3) at room temperature and elevated temperatures in accordance with an embodiment of the present disclosure.

In an example, the SiC driver die described above is placed inside a commercial power module (rated 1700 V/681 A) in order to evaluate its driving capability. FIGS. 7A-7C illustrate the clamped inductive load (CIL) test results for one of the SiC integrated gate driver modules (SiC3) at room temperature and elevated temperatures in accordance with an embodiment of the present disclosure. In particular, FIG. 7A illustrates the CIL test results for SiC3 integrated gate driver modules at room temperature. FIG. 7B illustrates the CIL test results for SiC3 integrated gate driver modules at 100° C. FIG. 7C illustrates the CIL test results for SiC3 integrated gate driver modules at 175° C.

Figure 8:
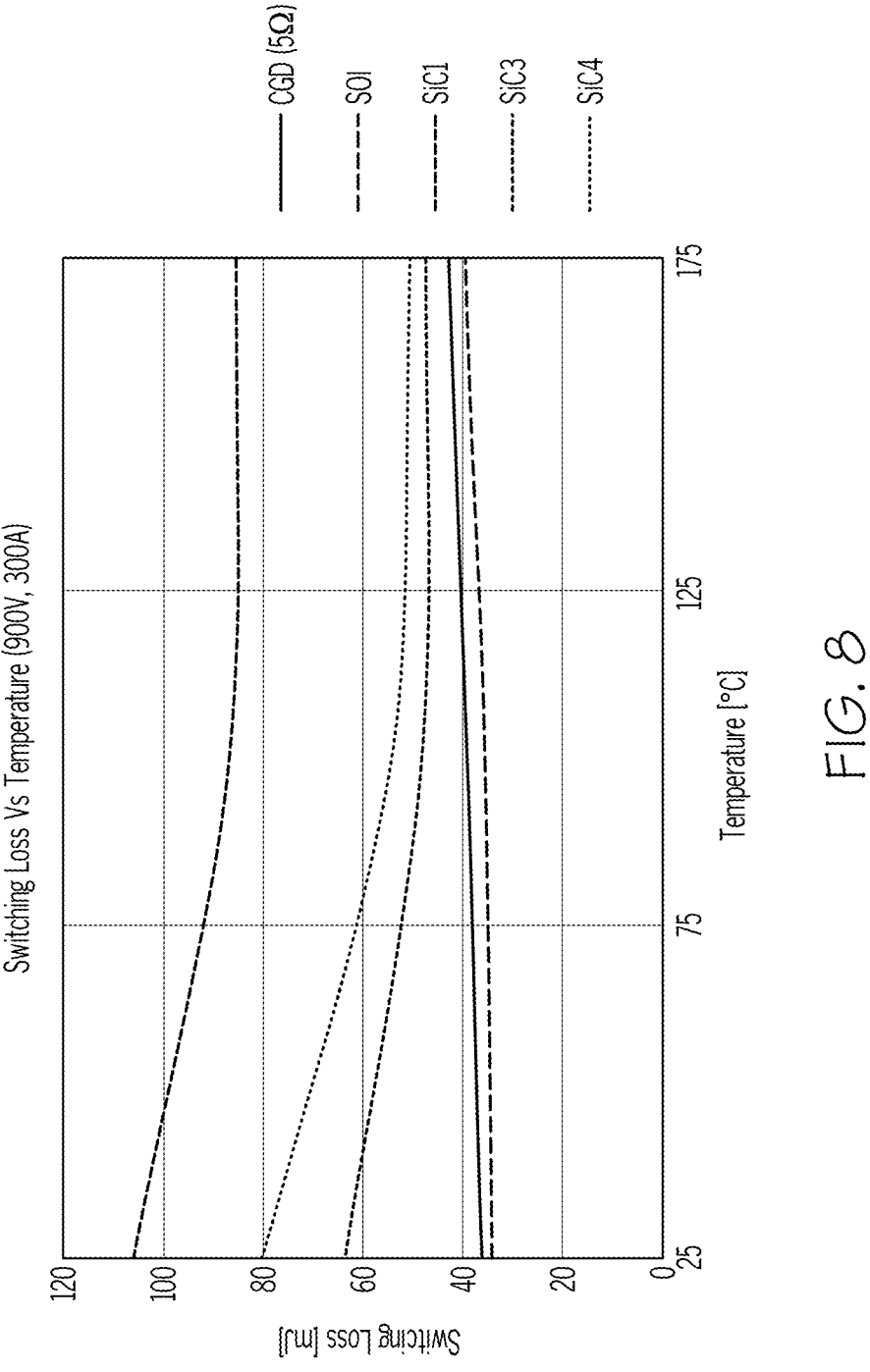
FIG. 8 summarizes how the switching loss varies with temperature for the different SiC gate driver variants in accordance with an embodiment of the present disclosure.

FIG. 8 summarizes how the switching loss varies with temperature for the different SiC gate driver variants in accordance with an embodiment of the present disclosure. For comparison purpose, tests have also been performed with a silicon-on-insulator (SOI) integrated gate driver module and a commercial module with an external Si gate driver (CGD). As shown, loss for the SiC variants goes down while the opposite occurs for the SOI and Si variants.

Additionally, to demonstrate the extended functionalities of the four-level AGD described above, double pulse test (DPT) experiments have been conducted using commercial Wolfspeed® 1.2 kV-65 A SiC MOSFETs (C2M0025120D). In one embodiment, the experiments were carried out at 400 V/40 A with different turn-on and turn-off intermediate voltage levels. The intermediate voltage level in turn-on was varied from 8 V to 20 V, in turn-off from −5 V to 3 V. Experimental waveforms are summarized in FIGS. 9A-9D.

Figures 9A, 9B:
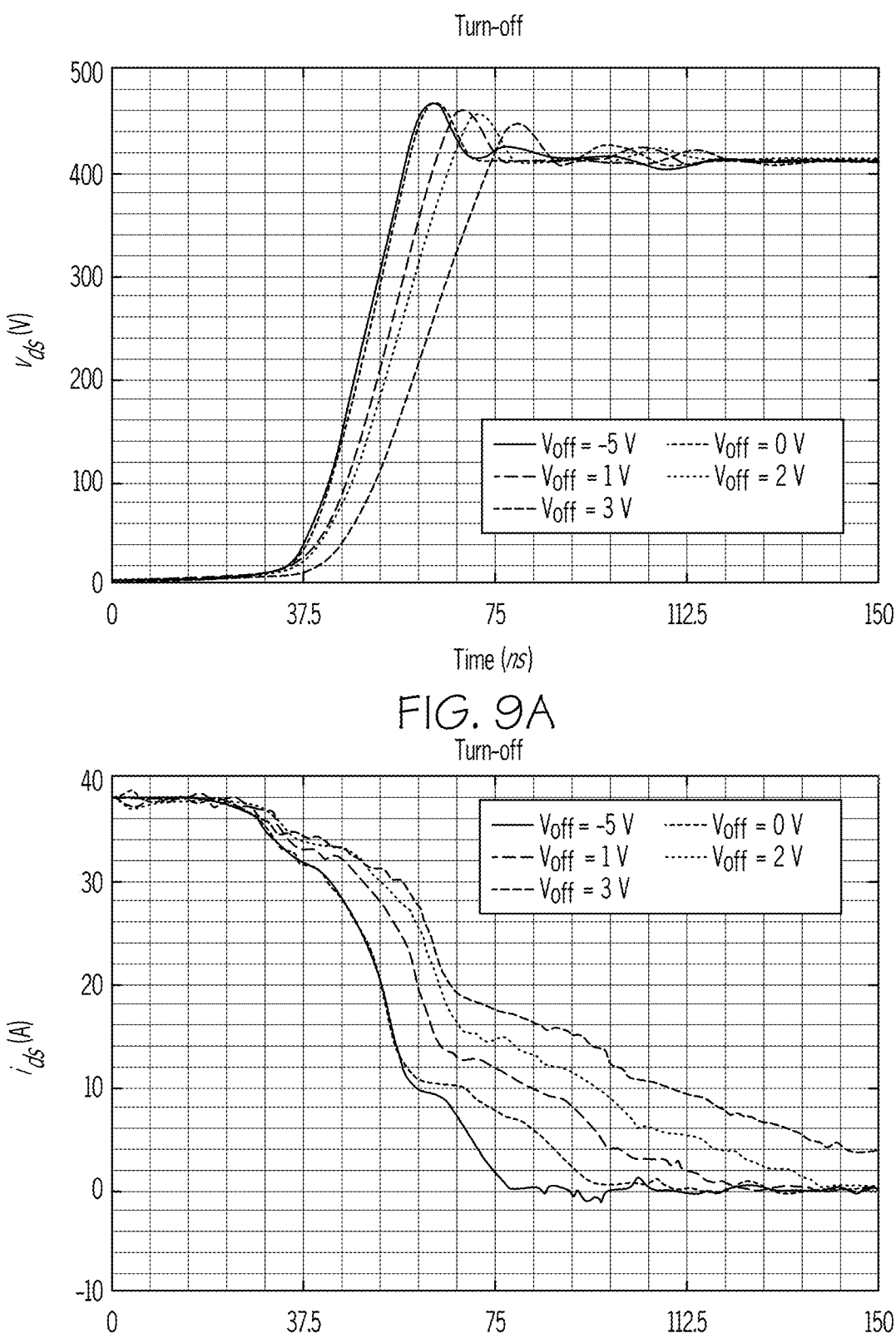
FIG. 9A illustrates the double pulse test being performed at the drain-to-source voltage in turn-off in accordance with an embodiment of the present disclosure.
FIG. 9B illustrates the double pulse test being performed at the drain-to-source current in turn-off in accordance with an embodiment of the present disclosure.
Figures 9C, 9D:
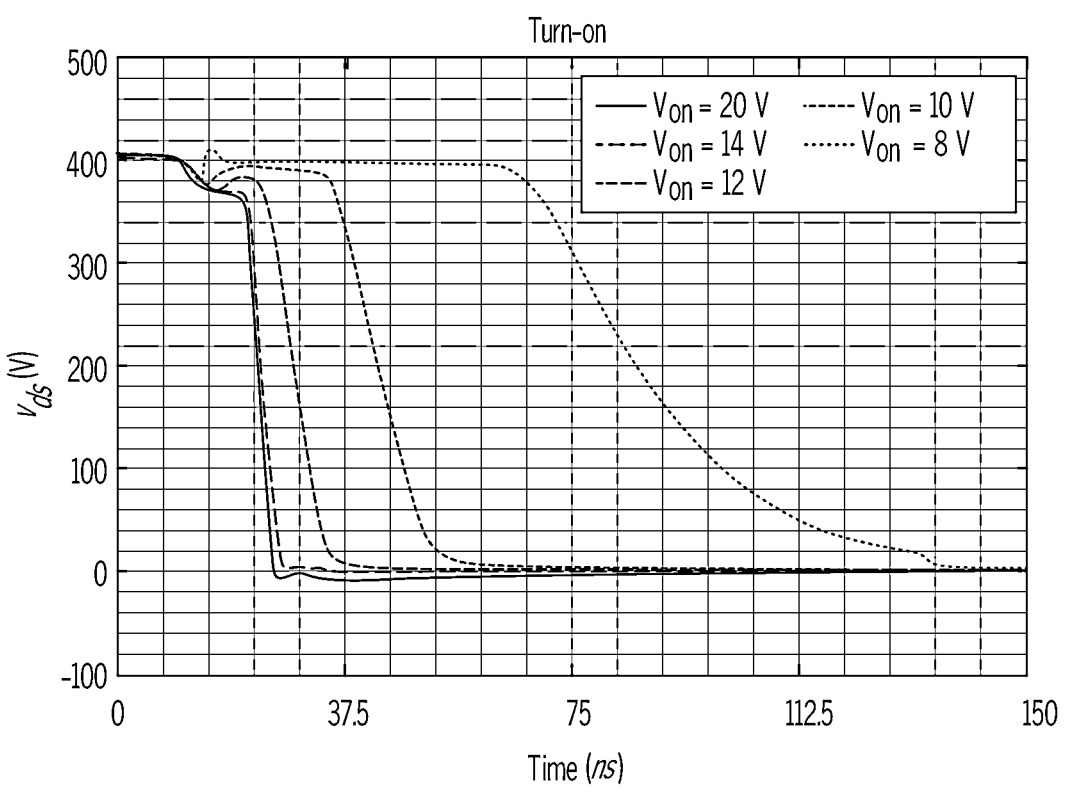
FIG. 9C illustrates the double pulse test being performed at the drain-to-source voltage in turn-on in accordance with an embodiment of the present disclosure.
FIG. 9D illustrates the double pulse test being performed at the drain-to-source current in turn-on in accordance with an embodiment of the present disclosure.

FIG. 9A illustrates the double pulse test being performed at the drain-to-source voltage in turn-off in accordance with an embodiment of the present disclosure. FIG. 9B illustrates the double pulse test being performed at the drain-to-source current in turn-off in accordance with an embodiment of the present disclosure. FIG. 9C illustrates the double pulse test being performed at the drain-to-source voltage in turn-on in accordance with an embodiment of the present disclosure. FIG. 9D illustrates the double pulse test being performed at the drain-to-source current in turn-on in accordance with an embodiment of the present disclosure.

Referring to FIGS. 9A-9D, the use of the intermediate voltage levels allowed the transitions' speed to be adjusted actively. In turn-off, it was possible to reduce the dv/dt from 15 V/ns to 1.6 V/ns and the di/dt from 1 A/ns to 0.1 A/ns. In turn-on, the dv/dt was tuned from 20 V/ns to 14 V/ns and the di/dt from 2 A/ns to 0.3 A/ns. This experiment demonstrates that in real converter operation, it is possible to choose optimal combinations of di/dt and dv/dt actively to minimize the negative effects of EMI noise.

To demonstrate the use of the proposed AGD circuit within the distributed and scalable gate driver architecture, shown in FIG. 6, in current balancing operations, an experiment has been performed using two parallel-connected SiC MOSFETs (C2M0025120D) with intrinsic circuit mismatch.

Figure 10A:
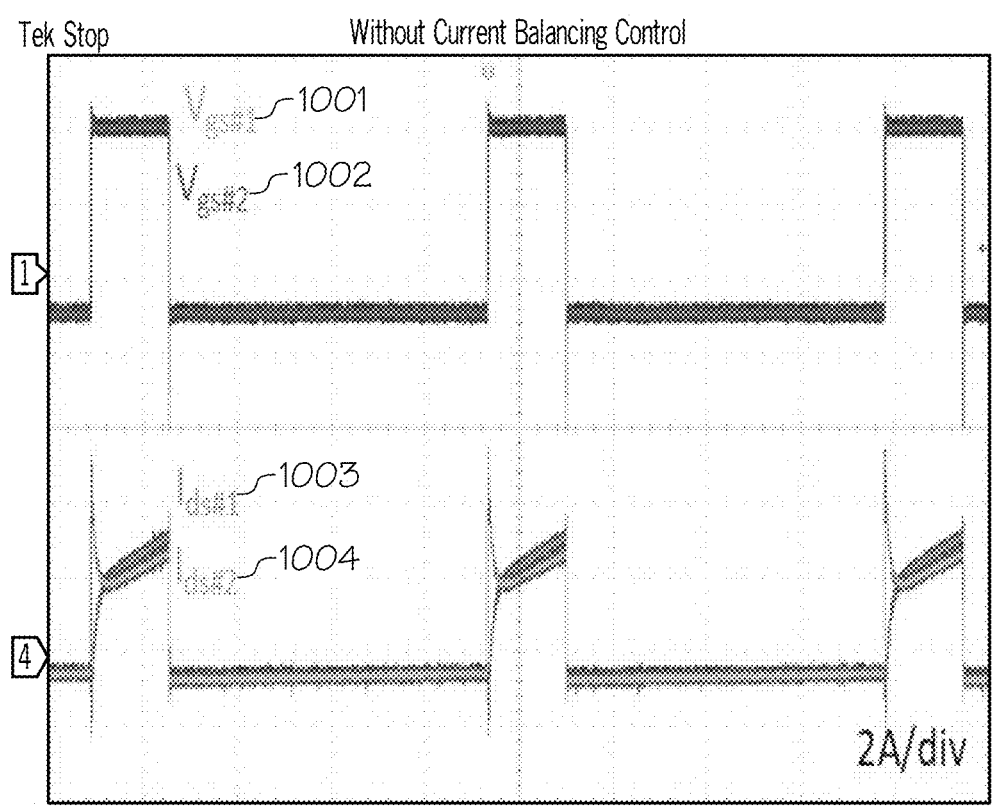
FIG. 10A illustrates current balancing without the control algorithm in accordance with an embodiment of the present disclosure.

Referring now to FIG. 10A, FIG. 10A illustrates current balancing without the control algorithm in accordance with an embodiment of the present disclosure. As shown in FIG. 10A, with the same gate voltages (top two waveforms 1001, 1002), the circuit mismatch causes a dynamic and static imbalance in the drain-to-source currents (bottom two waveforms 1003, 1004) of the two devices connected in parallel.

Figure 10B:
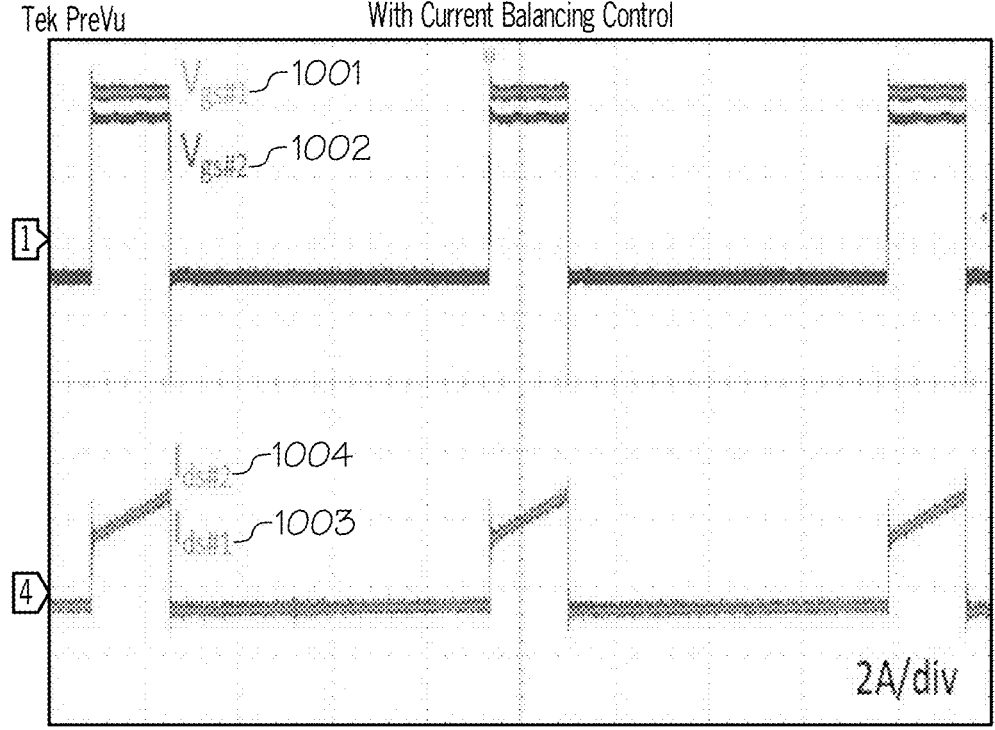
FIG. 10B illustrates current balancing with the control algorithm enabled in accordance with an embodiment of the present disclosure.

Referring now to FIG. 10B, FIG. 10B illustrates current balancing with the control algorithm enabled in accordance with an embodiment of the present disclosure. After enabling the balancing algorithm, the AGD circuit detects the current imbalance and actively adjusts the gate voltages to balance the current, both during the transient and in a steady state. In this way, thanks to a uniform energy loss distribution amongst parallel-connected devices, a higher power level can be achieved without compromising the safe operation of the converter.

The switching loss for SiC integrated gate driver modules is slightly higher than a commercial module with an external Si gate driver. However, the drive strength was limited to the output buffer size of the SiC die. Having subsequent SiC runs with improved process flow, the drive strength can be increased to reduce the switching loss.

In one embodiment, the AGD circuit shown in FIG. 5 includes a buffer stage that is implemented in a PCB (printed circuit board) using a commercial Si-based IC. The physical implementation of this circuit is depicted in FIG. 11A.

Figure 11A:
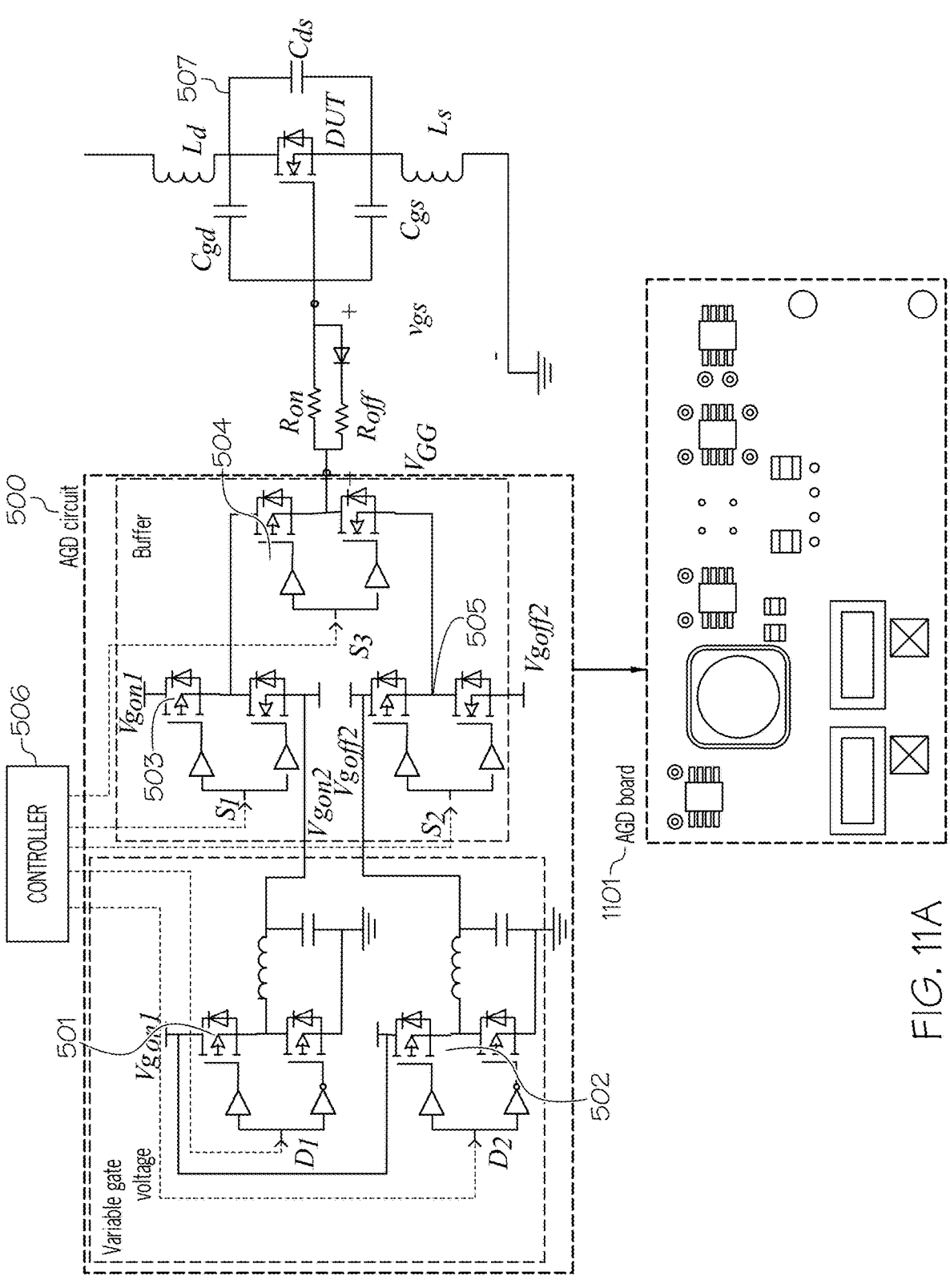
FIG. 11A illustrates a proposed AGD circuit and printed circuit board (PCB) implementation in accordance with an embodiment of the present disclosure.

FIG. 11A illustrates a proposed AGD circuit and PCB implementation in accordance with an embodiment of the present disclosure. As illustrated in FIG. 11A, in conjunction with FIG. 5, AGD circuit 500 includes buffers comprised of totem-pole circuits 503, 504, 505. In one embodiment, AGD circuit 500 is implemented on AGD board 1101.

Figure 11B:
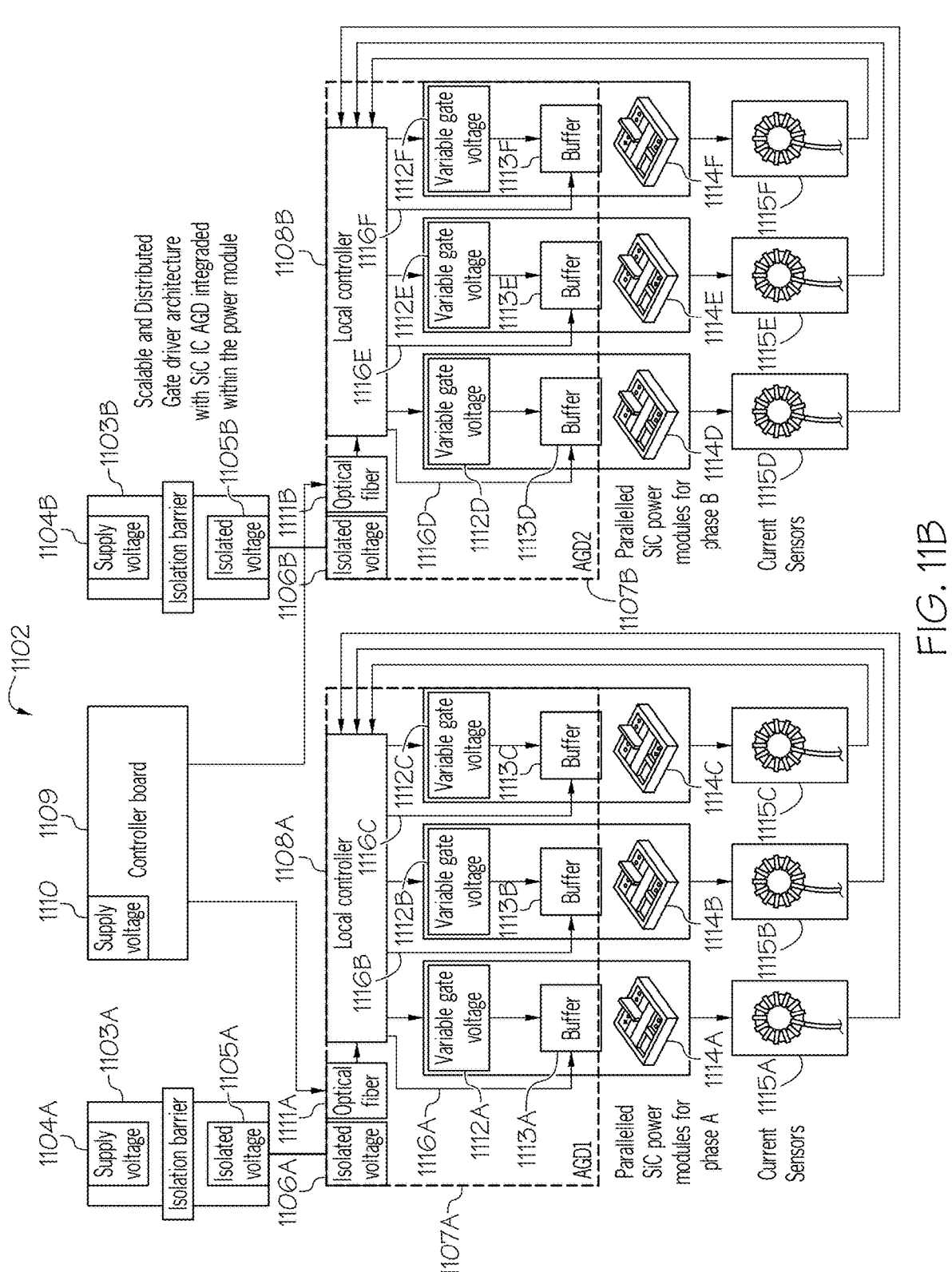
FIG. 11B illustrates a scalable and distributed AGD architecture to perform current balancing amongst parallel-connected devices utilizing SiC IC gate drivers directly integrated in the power module in accordance with an embodiment of the present disclosure.

The driving stage composed of semiconductor components can be integrated into a high-temperature SiC IC, which can be integrated inside the SiC power module, as shown in FIG. 11B. FIG. 11B illustrates a scalable and distributed AGD architecture to perform current balancing amongst parallel-connected devices utilizing SiC IC gate drivers directly integrated in the power module in accordance with an embodiment of the present disclosure.

As shown in FIG. 11B, FIG. 11B is a simplified version of FIG. 6, where the multi-level structure is replaced with a two-level structure. The turn-on gate voltage and turn-on delay time are used to achieve the current balancing operation.

Furthermore, as illustrated in FIG. 11B, the scalable and distributed gate driver architecture 1102 includes isolation barriers 1103A-1103B, that each contain a supply voltage 1104A-1104B, respectively, and an isolated voltage 1105A-1105B, respectively. Isolation barriers 1103A-1103B may collectively or individually be referred to as isolation barriers 1103 or isolation barrier 1103, respectively. Furthermore, supply voltages 1104A-1104B may collectively or individually be referred to as supply voltages 1104 or supply voltage 1104, respectively. Additionally, isolated voltages 1105A-1105B may collectively or individually be referred to as isolated voltages 1105 or isolated voltage 1105, respectively.

In one embodiment, isolated voltage 1105A-1105B is connected to isolated voltage 1106A-1106B, respectively, of AGD 1107A-1107B (identified as "AGD 1," and "AGD 2," respectively), respectively. AGD 1107A-1107B are configured similarly to AGD circuit 500. Isolated voltages 1106A-1106B may collectively or individually be referred to as isolated voltages 1106 or isolated voltage 1106, respectively. Furthermore, AGDs 1107A-1107B may collectively or individually be referred to as AGDs 1107 or AGD 1107, respectively.

Furthermore, in one embodiment, as shown in FIG. 11B, AGD 1107A-1107B includes a local controller 1108A-1108B (configured similarly to local controller 602 of FIG. 6), respectively. Local controllers 1108A-1108B may collectively or individually be referred to as local controllers 1108 or local controller 1108, respectively.

In one embodiment, one of the inputs to local controller 1108A-1108B includes a control signal from controller board 1109 with a power supply 1110 via optical fiber 1111A-1111B, respectively. Furthermore, as shown in FIG. 11B, local controller 1108A-1108B outputs a signal to variable gate voltage 1112A-1112C and 1112D-1112F, respectively, which feeds buffer 1113A-1113C and 1113D-1113F, respectively. Optical fibers 1111A-111B may collectively or individually be referred to as optical fibers 1111 or optical fiber 1111, respectively. Furthermore, variable gate voltages 1112A-1112F may collectively or individually be referred to as variable gate voltages 1112 or variable gate voltage 1112, respectively. Additionally, buffers 1113A-1113F may collectively or individually be referred to as buffers 1113 or buffer 1113, respectively.

In one embodiment, in addition to AGDs 1107 including the components discussed above (isolated voltage 1106, optical fiber 1107, local controller 1108, variable gate voltage 1112, buffer 1113), such AGDs 1107A-1107B include paralleled SiC power modules 1114A-1114C (for phase A) and 1114D-1114F (for phase B), respectively. SiC power modules 1114A-1114F may collectively or individually be referred to as SiC power modules 1114 or SiC power module 1114, respectively.

In one embodiment, the current of each SiC power module 1114A-1114F is sensed by current sensors 1115A-1115F, respectively, the output of which is inputted into the respected local controller 1108. For example, the output of current sensors 1115A-1115C is inputted into local controller 1108A and the output of current sensors 1115D-1115F is inputted into local controller 1108B. Current sensors 1115A-1115F may collectively or individually be referred to as current sensors 1115 or current sensors 1115, respectively.

Additionally, as shown in FIG. 11B, local controller 1108A, 1108B outputs a time delay signal ($t_{delay}$) 1116A-1116C and 1116D-1116F, respectively, which is fed into buffers 1113A-1113C and 1113D-1113F, respectively. Time delay signals 1116A-1116F may collectively or individually be referred to as time delay signals 1116 or time delay signal 1116, respectively.

In various embodiments, the principles described herein can achieve various advantages such as, for example, enabling high-temperature operation for harsh environments, reducing parasitics for improved performance, prolonging lifetime via the proposed AGD, and solving numerous critical issues for semiconductors. In various embodiments, the principles described in the present disclosure are applicable to multiple fields such as, for example, heavy transportation, motor drives, electric vehicle battery chargers, energy routers, and solid state transformers.

Furthermore, the adaptive active gate driver of the present disclosure increases the control flexibility of semiconductor devices so that their potential can be explored fully. In addition, the lifetime of devices, such as power devices, can be prolonged using the active gate driver of the present disclosure. Furthermore, electromagnetic interface noise, unbalanced current sharing among paralleled devices, and unbalanced voltage sharing among series-connected devices can be mitigated using the active gate driver of the present disclosure.

Conditional language used herein, such as, among others, "can," "might," "may," "e.g.," and the like, unless specifically stated otherwise, or otherwise understood within the context as used, is generally intended to convey those certain embodiments include, while other embodiments do not include, certain features, elements, and/or states. Thus, such conditional language is not generally intended to imply that features, elements, and/or states are in any way required for one or more embodiments or that one or more embodiments necessarily include logic for deciding, with or without author input or prompting, whether these features, elements, and/or states are included or are to be performed in any particular embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A multiphase converter, comprising:
a system controller;
a plurality of power devices; and
an active gate driver integrated circuit (IC) electrically connected to said system controller and said plurality of power devices, wherein said active gate driver IC receives signals from said system controller and provides outputs to said plurality of power devices based, at least in part, on real-time feedback from said plurality of power devices, wherein said active gate driver IC comprises a local controller that receives said signals from said system controller and provides said outputs to said plurality of power devices, and wherein said local controller varies said outputs to said plurality of power devices according to a multilevel voltage profile.

2. The multiphase converter as recited in claim 1, wherein said multilevel voltage profile comprises three or more voltage levels.

3. A multiphase converter, comprising:
a system controller;
a plurality of power devices; and
an active gate driver integrated circuit (IC) electrically connected to said system controller and said plurality of power devices, wherein said active gate driver IC receives signals from said system controller and provides outputs to said plurality of power devices based, at least in part, on real-time feedback from said plurality of power devices, wherein said active gate driver IC comprises a buffer stage, and wherein said buffer stage is implemented using totem-pole circuits used to sink and source a gate current, wherein said totem-pole circuits are configured to select a voltage level for each interval.

4. A multiphase converter, comprising:
a system controller;
a plurality of power devices; and
an active gate driver integrated circuit (IC) electrically connected to said system controller and said plurality of power devices, wherein said active gate driver IC receives signals from said system controller and provides outputs to said plurality of power devices based, at least in part, on real-time feedback from said plurality of power devices, wherein said active gate driver IC comprises buck converters.

5. The multiphase converter as recited in claim 4, wherein said buck converters generate variable intermediate gate voltage levels.

6. A power module package, comprising:
a silicon carbide (SiC) active gate driver; and
silicon carbide (SiC) power devices connected to said SiC active gate driver, wherein a die of said SiC active gate driver comprises a metal routing layer and a polysilicon routing layer.

7. The power module package as recited in claim 6, wherein said SiC power devices are connected to said SiC active gate driver in parallel.

* * * * *